US006703858B2

(12) United States Patent
Knowles (10) Patent No.: US 6,703,858 B2
(45) Date of Patent: Mar. 9, 2004

(54) LOGIC ARCHITECTURE FOR SINGLE EVENT UPSET IMMUNITY

(75) Inventor: Kenneth R. Knowles, Manassas, VA (US)

(73) Assignee: BAE Systems Information and Electronic Systems Integration, Inc., Manassas, VA (US)

(*) Notice: Subject to any disclaimer, the term of this patent is extended or adjusted under 35 U.S.C. 154(b) by 0 days.

(21) Appl. No.: 10/201,418

(22) Filed: Jul. 22, 2002

(65) Prior Publication Data

US 2002/0175713 A1 Nov. 28, 2002

Related U.S. Application Data

(62) Division of application No. 09/854,247, filed on May 11, 2001, now Pat. No. 6,614,257.
(60) Provisional application No. 60/203,895, filed on May 12, 2000.

(51) Int. Cl.[7] ............................................. H03K 19/003
(52) U.S. Cl. ................................. 326/9; 13/104; 13/27; 13/119; 365/205; 365/207; 365/189.05; 365/156; 716/17
(58) Field of Search ...................... 716/1–18; 326/9–15; 327/200, 201, 210, 225, 407; 257/369, 371, 379, 380; 365/53, 72, 156, 181, 190

(56) References Cited

U.S. PATENT DOCUMENTS

| 5,111,429 A | | 5/1992 | Whitaker |
| 5,175,605 A | | 12/1992 | Pavlu et al. |
| 5,311,070 A | | 5/1994 | Dooley |
| 5,418,473 A | | 5/1995 | Canaris |
| 5,870,332 A | | 2/1999 | Lahey et al. |
| 6,275,080 B1 | * | 8/2001 | Phan et al. .................. 327/200 |
| 6,278,287 B1 | | 8/2001 | Baze |
| 6,320,406 B1 | * | 11/2001 | Morgan et al. ............... 326/14 |
| 6,327,176 B1 | | 12/2001 | Li et al. |
| 6,369,630 B1 | * | 4/2002 | Rockett ....................... 327/210 |
| 6,392,474 B1 | * | 5/2002 | Li et al. ...................... 327/551 |
| 6,487,134 B2 | * | 11/2002 | Thoma et al. ............... 365/205 |
| 6,549,443 B1 | * | 4/2003 | Jensen et al. ................. 365/56 |
| 6,614,257 B2 | * | 9/2003 | Knowles ........................ 326/9 |

FOREIGN PATENT DOCUMENTS

| JP | 10294652 | 11/1998 |
| WO | PCT/US02/14932 | 8/2002 |

OTHER PUBLICATIONS

T. Calin, et al., Upset Hardened Memory Design For Sub–micron CMOS Technology, IEEE Transactions On Nuclear Science, vol. 43, No. 6, Dec., 1996, pp. 2874–2878.
M. Norley Liu, et al, Low Power SEU Immune CMOS Memory Circuits, IEEE Transactions On Nuclear Science, vol. 39, No. 6, Dec. 1992, pp. 1679–1684.
Barbour A E et al., "A General, Constructive Approach to Fault–Tolerant Design Using Redundancy", IEEE Transactions on Computers, IEEE Inc., New York, US, vol. 38, Nr. 1, pp. 15–29, 1989.
U. Tietze, Ch. Schenk, "Halbleiter–Schaltungstenchnik, fünte Auflage", Springer Verlag, Berlin, Heidelberg, New York, pp. 156–158, 1980.

* cited by examiner

Primary Examiner—Vibol Tan
(74) Attorney, Agent, or Firm—Daniel J. Long; Graybeal Jackson Haley LLP (57) ABSTRACT

An SEU immune logic architecture includes a dual path logic gate coupled to a dual to single path converter. A first and a second logic element within the dual path logic gate are functionally and possibly structurally equivalent, and are coupled to receive input signals spanning redundant input signal sets. A given logic structure within the first logic element may receive specified input signals within a particular input signal set, while an analogous logic structure within the second logic element may receive corresponding input signals within the counterpart input signal set. A radiation induced transient pulse that affects one input signal may affect an output signal asserted by one logic structure; however, since the transient pulse doesn't affect a corresponding input signal applied to the analogous logic structure, the dual path logic gate may output at least one correctly valued signal when a transient pulse occurs. The dual to single path converter is coupled to receive signals output by the dual path logic gate. In the event that a transient signal appears at an input of the dual to single path converter, a current path may be interrupted, and a correct output signal value is maintained as a result of stray capacitance present at an output node.

21 Claims, 10 Drawing Sheets

| I1 | I2 | T1 | T2 | P1 (I1) | N1 (I2) | O1 | P2 (I2) | N2 (I1) | O2 | Remark |
|---|---|---|---|---|---|---|---|---|---|---|
| 0 | 0 |   |   | on | off | 1 | on | off | 1 | no SEU |
| 0 | 0 | 1 |   | off | off | held | on | on | cont. | SEU |
| 0 | 0 |   | 1 | on | on | cont. | off | off | held | SEU |
| 1 | 1 |   |   | on | on | 0 | off | on | 0 | no SEU |
| 1 | 1 | 0 |   | on | off | cont. | off | off | held | SEU |
| 1 | 1 |   | 0 | off | on | held | on | on | cont. | SEU |

FIG. 8

| I1.1 | I1.2 | I2.1 | I2.2 | T1.1 | T1.2 | T2.1 | T2.2 | P1a (I2.2) | P1b (I2.1) | N1a (I1.1) | N1b (I1.2) | O1 | P2a (I1.1) | P2b (I1.2) | N2a (I2.1) | N2b (I2.2) | O2 | Remark |
|---|---|---|---|---|---|---|---|---|---|---|---|---|---|---|---|---|---|---|
| 0 | 0 | 0 | 0 |   |   |   |   | on | on | off | off | 1 | on | on | off | off | 1 | no SEU |
| 0 | 0 | 0 | 0 | 1 |   |   |   | on | on | on | off | 1 | off | on | off | off | 1 | SEU |
| 0 | 0 | 0 | 0 |   | 1 |   |   | on | on | off | on | 1 | on | off | off | off | 1 | SEU |
| 0 | 0 | 0 | 0 |   |   | 1 |   | on | off | off | off | 1 | on | on | on | off | 1 | SEU |
| 0 | 0 | 0 | 0 |   |   |   | 1 | off | on | off | off | 1 | on | on | off | on | 1 | SEU |
| 0 | 1 | 0 | 1 |   |   |   |   | off | on | on | on | 1 | off | off | off | on | 1 | no SEU |
| 0 | 1 | 0 | 1 | 1 |   |   |   | off | on | off | on | cont. | on | on | off | on | held | SEU |
| 0 | 1 | 0 | 1 |   | 0 |   |   | off | off | off | off | 1 | off | on | off | on | 1 | SEU |
| 0 | 1 | 0 | 1 |   |   | 1 |   | on | on | off | on | held | off | off | on | on | cont. | SEU |
| 0 | 1 | 0 | 1 |   |   |   | 0 | on | on | off | on | held | off | off | off | off | 1 | SEU |
| 1 | 0 | 1 | 0 |   |   |   |   | on | off | on | off | 1 | on | on | on | off | 1 | no SEU |
| 1 | 0 | 1 | 0 | 0 |   |   |   | on | off | off | off | 1 | off | off | on | off | held | SEU |
| 1 | 0 | 1 | 0 |   | 1 |   |   | off | on | on | on | cont. | off | on | on | off | 1 | SEU |
| 1 | 0 | 1 | 0 |   |   | 0 |   | off | off | on | off | 1 | off | off | off | on | held | SEU |
| 1 | 0 | 1 | 0 |   |   |   | 1 | off | off | on | off | held | off | on | on | on | cont. | SEU |
| 1 | 1 | 1 | 1 |   |   |   |   | off | off | on | on | 0 | off | off | on | on | 0 | no SEU |
| 1 | 1 | 1 | 1 | 0 |   |   |   | off | off | off | on | held | off | off | on | on | cont. | SEU |
| 1 | 1 | 1 | 1 |   | 0 |   |   | off | on | on | off | held | off | off | off | on | cont. | SEU |
| 1 | 1 | 1 | 1 |   |   | 0 |   | off | off | on | on | cont. | on | off | off | on | held | SEU |
| 1 | 1 | 1 | 1 |   |   |   | 0 | on | off | on | on | cont. | off | off | on | off | held | SEU |

FIG. 9

| I1.1 | I1.2 | I2.1 | I2.2 | T1.1 | T1.2 | T2.1 | T2.2 | P1a (I1.1) | P1b (I1.2) | N1a (I2.1) | N1b (I2.2) | O1 | P2a (I2.1) | P2b (I2.2) | N2a (I1.1) | N2b (I1.2) | O2 | Remark |
|---|---|---|---|---|---|---|---|---|---|---|---|---|---|---|---|---|---|---|
| 0 | 0 | 0 | 0 |   |   |   |   | off | on | off | off | 1 | on | on | on | on | 1 | no SEU |
| 0 | 0 | 0 | 0 | 1 |   |   |   | on | off | off | off | held | on | on | on | off | cont. | SEU |
| 0 | 0 | 0 | 0 |   | 1 |   |   | on | on | off | off | held | on | on | off | on | cont. | SEU |
| 0 | 0 | 0 | 0 |   |   | 1 |   | on | on | on | off | cont. | off | on | off | off | held | SEU |
| 0 | 0 | 0 | 0 |   |   |   | 1 | on | on | off | on | cont. | on | off | off | off | held | SEU |
| 0 | 1 | 0 | 1 |   |   |   |   | off | off | off | on | 0 | on | off | on | on | 0 | no SEU |
| 0 | 1 | 0 | 1 | 1 |   |   |   | on | on | off | on | 0 | on | off | on | off | cont. | SEU |
| 0 | 1 | 0 | 1 |   | 0 |   |   | on | off | off | on | cont. | off | off | off | on | held | SEU |
| 0 | 1 | 0 | 1 |   |   | 1 |   | on | off | off | off | 0 | on | off | on | on | 0 | SEU |
| 0 | 1 | 0 | 1 |   |   |   | 0 | on | off | on | on | held | on | on | on | off | cont. | SEU |
| 1 | 0 | 1 | 0 |   |   |   |   | on | on | on | off | 0 | off | on | off | off | 0 | no SEU |
| 1 | 0 | 1 | 0 | 0 |   |   |   | off | off | on | off | cont. | off | on | on | on | held | SEU |
| 1 | 0 | 1 | 0 |   | 1 |   |   | off | on | on | off | 0 | on | on | off | off | 0 | SEU |
| 1 | 0 | 1 | 0 |   |   | 0 |   | off | on | off | off | held | off | on | on | on | cont. | SEU |
| 1 | 0 | 1 | 0 |   |   |   | 1 | off | on | on | on | cont. | off | off | on | off | held | SEU |
| 1 | 1 | 1 | 1 |   |   |   |   | on | off | on | on | 0 | off | off | on | on | 0 | no SEU |
| 1 | 1 | 1 | 1 | 0 |   |   |   | off | on | on | on | 0 | off | off | on | on | 0 | SEU |
| 1 | 1 | 1 | 1 |   | 0 |   |   | off | off | on | on | 0 | off | on | on | off | 0 | SEU |
| 1 | 1 | 1 | 1 |   |   | 0 |   | off | off | off | on | held | on | on | on | on | 0 | SEU |
| 1 | 1 | 1 | 1 |   |   |   | 0 | off | off | on | off | held | off | on | on | on | 0 | SEU |

FIG. 10

LOGIC ARCHITECTURE FOR SINGLE EVENT UPSET IMMUNITY

This is a divisional of the prior application Ser. No. 09/854,247, filed May 11, 2001, now U.S. Pat. No. 6,614,257 which claims priority from Ser. No. 60/203,895, filed May 12, 2000, the benefit of the filing dates of which are hereby claimed under 35 USC 120.

BACKGROUND OF THE INVENTION

1. Field of the Invention

The present invention relates generally to radiation-hardened circuitry. More particularly, this invention comprises a logic family architecture capable of maintaining output signal integrity in the presence of transient signals caused by radiation.

2. Description of the Background Art

Electronic systems deployed in outer space or orbital environments may be subject to bombardment by high-energy particles, for example, protons, alpha particles, and/or other types of cosmic rays. Such high-energy particles may induce signal errors and possibly damage circuitry. For example, during periods of high solar flare activity, or in orbital regions characterized by radiation belt anomalies, high-energy particle bombardment may render communication satellites temporarily or permanently unreliable.

When a high-energy particle impinges upon an integrated circuit, it ionizes the regions through which it travels. This ionization creates mobile charges in the vicinity of the particle's travel path, thereby generating a transient signal or pulse in the device. The transient pulse may produce a Single Event Upset (SEU), which is a random, soft (i.e., nondestructive) logic or signal error. An SEU may change critical data and/or alter program or processor state. Depending upon severity, a circuit, device, or system may require a power reset to recover from an SEU.

A variety of approaches for reducing or minimizing SEU susceptibility exist. Special integrated circuit fabrication techniques, such as Silicon-on-Insulator (SOI) processes, may reduce SEU susceptibility. However, special fabrication techniques are significantly more costly than standard integrated circuit manufacturing processes.

An SEU is less likely to occur if the magnitude of its associated transient pulse is significantly less than the magnitude of normal signals within a device. Larger devices generally operate using larger-magnitude signals. Hence, another way to minimize SEU susceptibility is through the use of large-area devices. Unfortunately, large-area circuitry is less area-efficient, necessitates higher manufacturing costs, and consumes more power than densely packed circuitry. As a result, large area circuitry suffers from significant drawbacks relative to outer space or orbital applications.

Another approach to reducing SEU susceptibility is known as Triple Modular Redundancy (TMR), which involves replicating independent logic gates or stages three times. Each stage provides an output to a voting circuit, which determines a final output state as that which is output by a majority of the stages. The redundancy that TMR requires unfortunately results in drawbacks similar to those for large-area circuitry.

Figure 1:
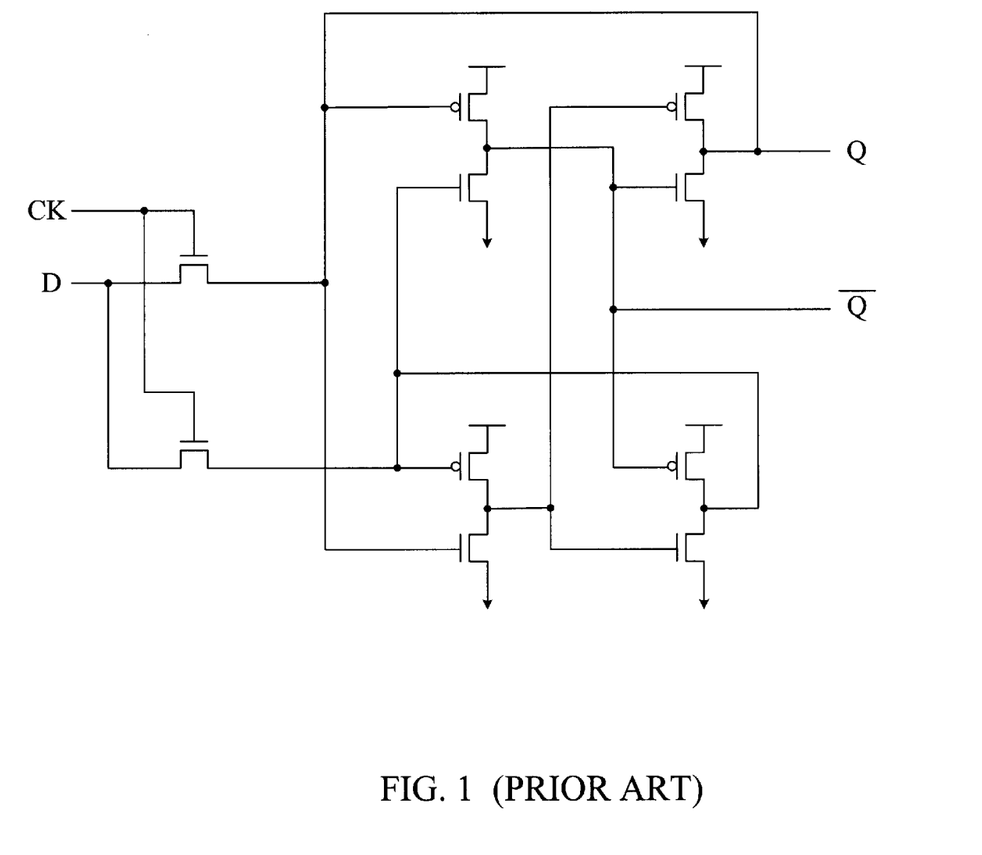
FIG. 1 is a circuit diagram of an SEU immune storage cell of the prior art.

Yet another approach toward minimizing SEU susceptibility is circuit design modification. Such modification involves duplication of storage elements and provision of state-restoring feedback paths. FIG. 1 is a circuit diagram of an SEU immune storage cell that includes state-restoring feedback paths. The SEU immune storage cell may serve as a latch or flip flop, or an element within a memory.

Unfortunately, prior circuit design modifications for minimizing SEU susceptibility are generally directed toward sequential, latching, and/or storage elements, rather than fundamental logic structures. What is needed is a comprehensive logic architecture that provides SEU immunity with minimal circuit redundancy, and which may be manufactured using conventional integrated circuit fabrication techniques.

SUMMARY OF THE INVENTION

The present invention is a logic architecture that may provide SEU immunity. In one embodiment, the logic architecture comprises a dual path logic element coupled to a dual to single path converter. The dual path logic element may comprise a first and a second logic element, which may be logically, and possibly structurally, equivalent. Each of the first and second logic elements includes a set of inputs and an output.

The first and second logic elements are each coupled to receive input signals spanning redundant input signal sets, where corresponding input signals within a first and a second input signal set are identically valued in the absence of a radiation induced transient pulse. The input signals are coupled within the first and second logic elements in an interleaved manner. In particular, corresponding logic structures and/or gates within each of the first and second logic elements may be coupled to receive input signals from opposite input signal sets. Thus, a given logic structure within the first logic element may be coupled to receive particular input signals within the first input signal set, while an analogous logic structure within the second logic element may be coupled to receive corresponding input signals within the second input signal set.

A radiation event may produce a transient pulse that is superimposed or carried upon an input signal. In the event that a transient pulse affects a given input signal within the first input signal set, a logic structure within the first logic element, for example, may temporarily assert or output an undefined or incorrect value. The transient pulse, however, may not affect the corresponding input signal within the second input signal set, and hence an analogous logic structure within the second logic element continues to assert or output a correct logical value. Thus, the dual path logic element may output at least one correctly valued signal following an occurrence of a radiation induced transient pulse.

The dual to single path converter includes inputs and an output, and may be coupled to receive signals produced by the aforementioned first and second logic elements. The dual to single path converter may act as a filter relative to signal transitions, such that it maintains or holds a given output state when a signal present at its inputs experiences a transition due to a transient pulse.

In one embodiment, the dual to single path converter comprises a first inverter structure that is embedded within a current path of a second inverter structure. The first inverter structure may be coupled to receive an output of the first logic element, while the second inverter structure may be coupled to receive an output of the second logic element. An output of the dual to single path converter may be provided by the first inverter structure.

When the dual to single path converter receives identically valued input signals, both inverter structures are in an identical operational state, and thus the dual to single path converter asserts an output signal having a particular desired value. A transient pulse may cause a signal applied to an input of the dual to single path converter to experience a transition of sufficient magnitude to cause the inverter structure to which it is coupled to switch to an opposite operational state. As a result, current flow within or through the dual to single path converter may be temporarily interrupted. During this temporary interruption, the stray or parasitic capacitance present at the dual to single path converter's output node maintains the output signal in its most recent state. In one embodiment, the dual to single path converter corresponds to a Muller C-element.

Depending upon embodiment and/or implementation details, dual path logic elements may be cascaded prior to delivering signals to the dual to single path converter. Other logic gates and/or circuits, such as conventional inverters large enough to remain unaffected by a transient pulse, may also be incorporated into circuit paths that include a dual path logic element and/or a dual to single path converter.

DETAILED DESCRIPTION

The following discussion is presented to enable a person skilled in the art to make and use the invention. The general principles described herein may be applied to embodiments and applications other than those detailed below without departing from the spirit and scope of the present invention as defined by the appended claims. The present invention is not intended to be limited to the embodiments shown, but is to be accorded the widest scope consistent with the principles and features disclosed herein.

Figure 2:
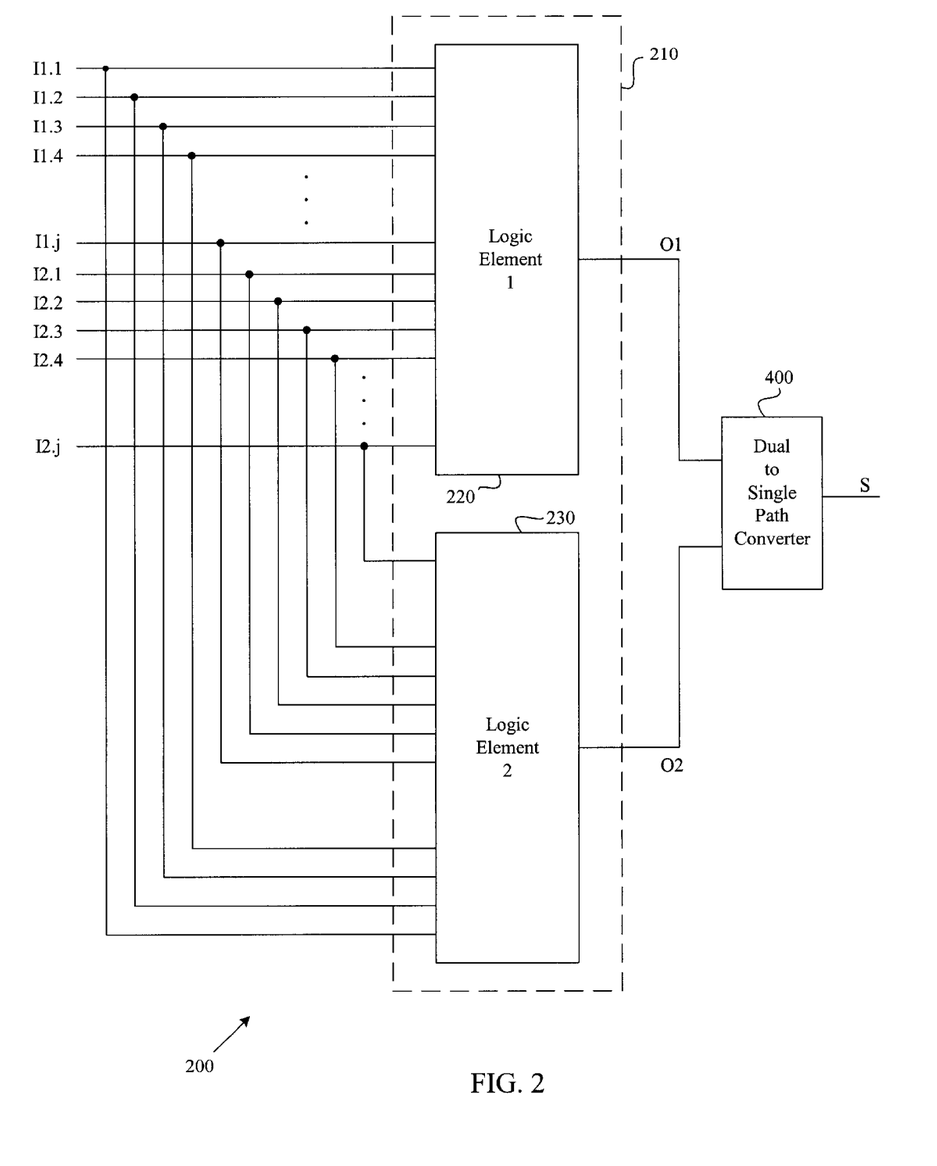
FIG. 2 is a block diagram of an SEU immune logic architecture organized in accordance with the present invention.

FIG. 2 is a block diagram of an SEU immune logic or logic family architecture 200 organized in accordance with the present invention. In one embodiment, the SEU immune logic architecture 200 comprises a dual path logic element 210 coupled to a dual to single path converter 400. Depending upon embodiment and/or implementation details, the SEU immune logic architecture 200 may include multiple or cascaded dual path logic elements 210. The dual path logic element 210 includes a first logic element 220 and a second logic element 230, which in one embodiment are logically equivalent in terms of a function that maps signals from one or more inputs to an output. The first and second logic elements 220, 230 may further be structurally equivalent, depending upon embodiment and/or implementation details.

The dual path logic element 210 operates upon redundant sets of input signals, where corresponding signals within such redundant sets correspond to an identical logic state or value in the absence of a transient pulse or SEU. The redundant sets of input signals may comprise a first set of input signals I1 and a second set of input signals I2. Any given input signal may be referenced as Is.q, where s indicates a particular input signal set, and q indicates a particular signal number within the specified set. For example, within the second input signal set, a third signal may be referenced as I2.3. In the absence of a transient pulse or SEU, signal I2.3 corresponds to the same logic state as signal I1.3. Those skilled in the art will understand that for redundant input signal sets in which each set consists of a single signal, the signal number indication may be omitted.

In the dual path logic element 210, the first and second logic elements 220, 230 may each receive the signals spanning the redundant input signal sets. Such signals are coupled in an interleaved manner within the first and second logic elements 220, 230, for suppressing or eliminating transient signal induced errors as described in detail below. The dual path logic element 210 may implement a logic function, and/or provide a signal corresponding to a given bit within a multi-bit path. The first and second logic elements 220, 230 may comprise inverters, NAND gates, NOR gates, XOR gates, or essentially any type of logic structures. Various embodiments of the dual path logic element 210 are described in detail hereafter.

Figure 3:
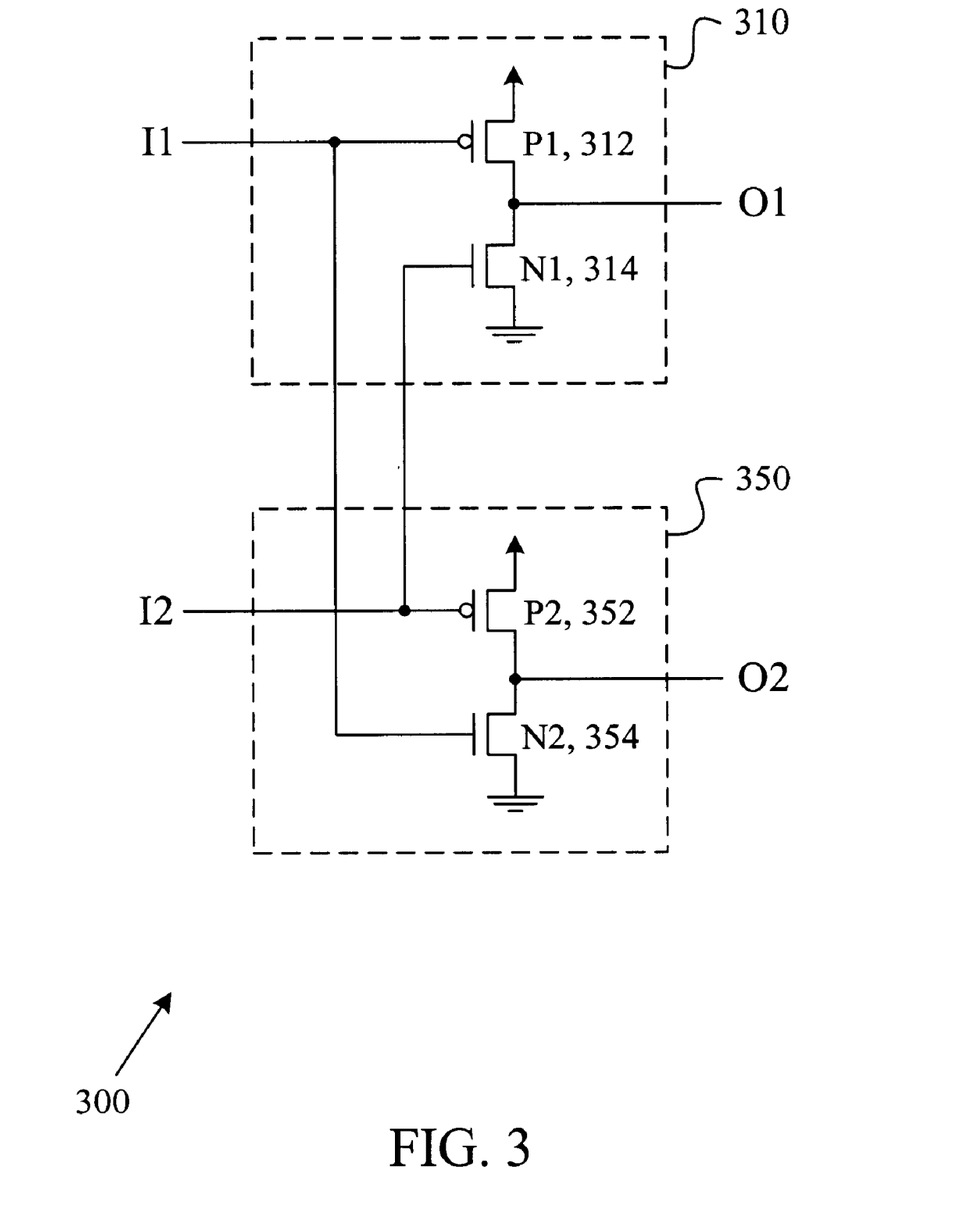
FIG. 3 is a circuit diagram of a dual path inverter according to an embodiment of the invention.

FIG. 3 is a circuit diagram of a dual path inverter 300 according to an embodiment of the invention. The dual path inverter 300 comprises a first inverter 310 and a second inverter 350. In one embodiment, each of the first and second inverters 310, 350 is conventional, and may be implemented using Complementary Metal Oxide Semiconductor (CMOS) technology. In the embodiment shown, the first inverter 310 comprises a P-channel MOS (PMOS) transistor 312 and an N-channel MOS (NMOS) transistor 314. Similarly, the second inverter 350 comprises a PMOS transistor 352 and an NMOS transistor 354.

Each of the aforementioned transistors includes a gate, a source, and a drain in accordance with conventional MOS transistor design. The PMOS transistors' sources are coupled to a high voltage reference or logic 1 value, while the NMOS transistors' sources are coupled to a low voltage reference or logic 0 value. Within the first inverter 310, the PMOS transistor's drain is coupled to the NMOS transistor's drain, forming a first output that provides a signal O1. Similarly, within the second inverter 350, the PMOS transistor's drain is coupled to the NMOS transistor's drain, forming a second output that provides a signal O2.

The PMOS and NMOS transistors' gates are coupled to receive input signals in an interleaved manner. In particular, for an input signal I1 and a corresponding duplicate input signal I2, the gate of the first inverter's PMOS transistor 312 is coupled to receive I1, while the gate of its NMOS transistor 314 is coupled to receive I2. The gate of the second inverter's PMOS transistor 352 is coupled to receive I2, while the gate of its NMOS transistor 354 is coupled to receive I1.

In the absence of a transient pulse, input signals I1 and I2 correspond to the same logic state. When signals I1 and I2 both correspond to logic 0, the PMOS transistors 312, 352 are on, the NMOS transistors 314, 354 are off, and the first and second inverters 310, 350 each assert a logic 1 at their outputs (i.e., signals O1 and O2 correspond to logic 1). Conversely, when signals I1 and I2 both correspond to logic 1, the PMOS transistors 312, 352 are off, the NMOS transistors 314, 354 are on, and the first and second inverters 310, 350 assert a logic 0 at their outputs.

If an SEU occurs, a transient pulse may be superimposed or carried upon either of signals I1 and I2, and hence signals I1 and I2 may correspond to different logic values for a limited time interval. In other words, signals I1 and I2 may experience temporary logic value transitions as a result of an SEU. Such logic value transitions may affect signal values present at particular transistor gates. The manner in which signals I1 and I2 are cross coupled within the first and second inverters 310, 350 may ensure that at least one of the output signals O1 and O2 is maintained when input signal transitions occur, as described in detail hereafter.

Figure 8:
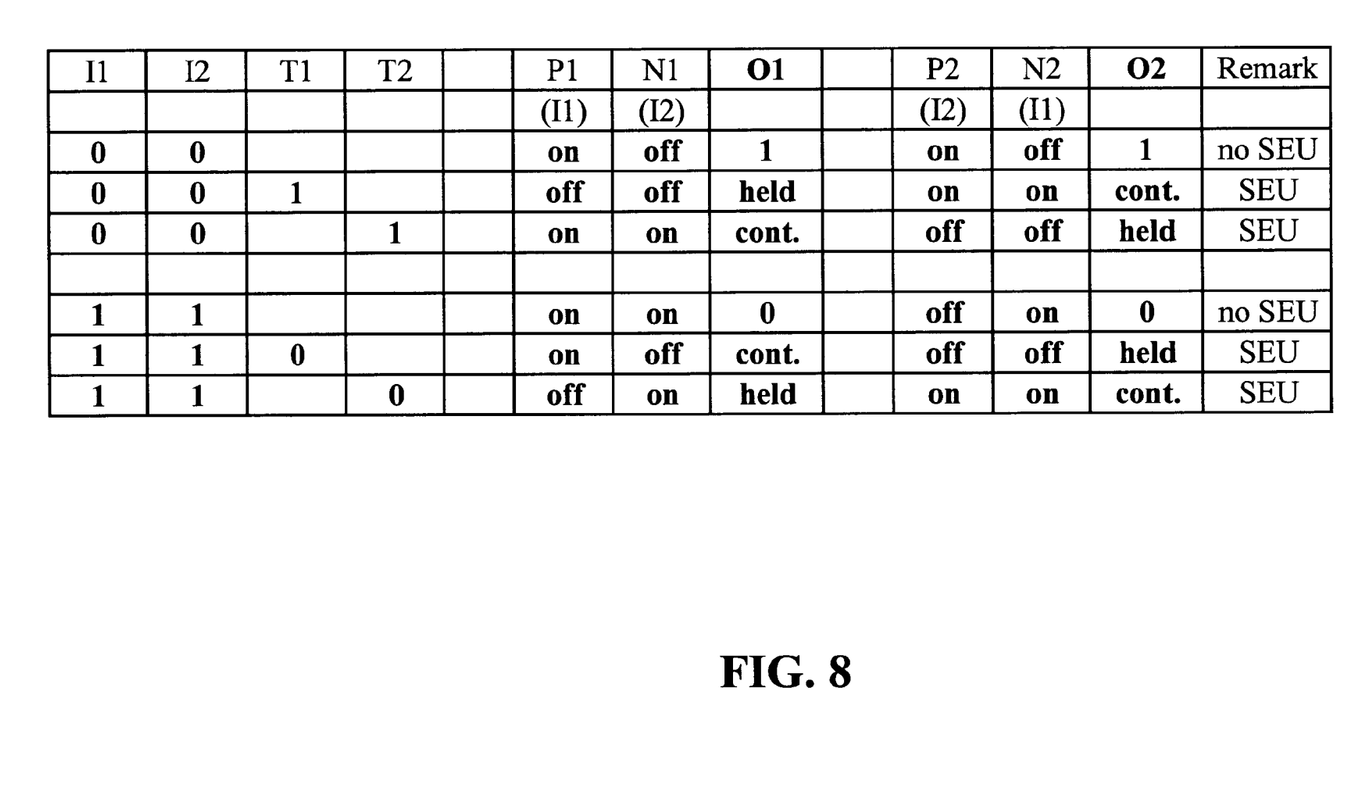
FIG. 8 is a table showing output signal values as a function of input signal values and input signal transitions that may arise from an SEU affecting the dual path inverter of FIG. 3.

FIG. 8 shows output signal values as a function of input signal values and input signal transitions that may arise from an SEU affecting the dual path inverter 300 of FIG. 3. As above, the input and output signals are defined as I1, I2, O1, and O2. In addition, T1 and T2 indicate input signal transitions corresponding to input signals I1 and I2, respectively. When I1 and I2 correspond to or equal logic 0, an SEU may produce a low to high signal transition. In FIG. 8, a low to high signal transition affecting I1 is indicated when T1 equals 1, and a low to high signal transition affecting I2 is indicated when T2 equals 1. When I1 and I2 equal 1, an SEU may produce a high to low signal transition. Thus, in FIG. 8, a high to low signal transition affecting I1 is indicated when T1 equals 0. A high to low signal transition affecting I2 is indicated when T2 equals 0.

When I1 and I2 equal 0, and T1 equals 1, the PMOS and NMOS transistors 312, 314 within the first inverter 310 are in an off state. The value of signal O1 at the first inverter's output is held or maintained at its most recent value, logic 1, as a result of parasitic or stray capacitance present at the first inverter's output node. Those skilled in the art will understand that such capacitance is inherently present within the first inverter 310, and that the first inverter 310 may be designed and/or fabricated to achieve a desired level of stray capacitance at its output node.

Because T1 is a transient signal, the stray capacitance need not sustain output signal O1 for a long period of time, and hence the stray capacitance need not be excessively large. For example, in the event that T1 lasts approximately 200 ps and corresponds to a triangular wave exhibiting a peak current of approximately 16 mA, the total charge associated with T1 is approximately 1.6 pC. In the event that T1 causes a voltage swing of 5 V, a stray capacitance of less than 0.5 pF may be sufficient to preserve the state of O1. Those skilled in the art will understand that a stray capacitance of this magnitude is readily achievable using conventional circuit design techniques and/or manufacturing processes.

When I1 and I2 equal 0, and T1 equals 1, the PMOS and NMOS transistors 352, 354 within the second inverter 350 are both in an on state. Thus, second inverter's PMOS and NMOS transistors 352, 354 are temporarily in a state of contention, and the value of output signal O2 depends upon the relative strength of each transistor 352, 354. Thus, when I1 and I2 equal 0, and while T1 equals 1, the state of signal O2 is undefined.

Notwithstanding, the dual path inverter 300 preserves the value of signal O1 at logic 1, and therefore provides at least one correctly valued output signal.

When I1 and I2 equal 1, and T1 equals 0, the first inverter's PMOS and NMOS transistors 312, 314 are both on, and hence in a contention state. The value of signal O1 during the existence of signal T1 depends upon the relative strengths of the first PMOS and NMOS transistors 312, 314, and therefore signal O1 is temporarily undefined.

When I1 and I2 equal 1, and T2 equals 0, the second inverter's PMOS and NMOS transistors 352, 354 are off. In such a situation, the stray capacitance present at the second inverter's output node maintains the state of signal O2 during the existence of signal T2. In view of the foregoing, when I1 and I2 equal 1, the dual path inverter 310 outputs at least one correctly valued signal following an occurrence of an SEU.

In the event that cosmic ray events produce one or more transient pulses that affect both I1 and I2 essentially simultaneously or in a temporally overlapping manner (i.e., T1 and T2 cause both I1 and I2 to transition from logic 0 to logic 1, or both I1 and I2 to transition from logic 1 to logic 0), the dual path inverter 310 may temporarily assert or produce incorrect signal values at each of its outputs. Those skilled in the art will recognize that the likelihood of one or more transient pulses affecting both I1 and I2 essentially simultaneously or in a temporally overlapping manner is dependent upon 1) device geometry and design rules, including circuit node separation distance, and/or the distance between p and n type diffusion regions; and 2) expected cosmic ray flux in a circuit's operating environment, which in itself may influence design rule choices. In an exemplary embodiment, a minimum separation distance of 3 microns between critical diffusion nodes may serve as one such design rule.

Figure 4:
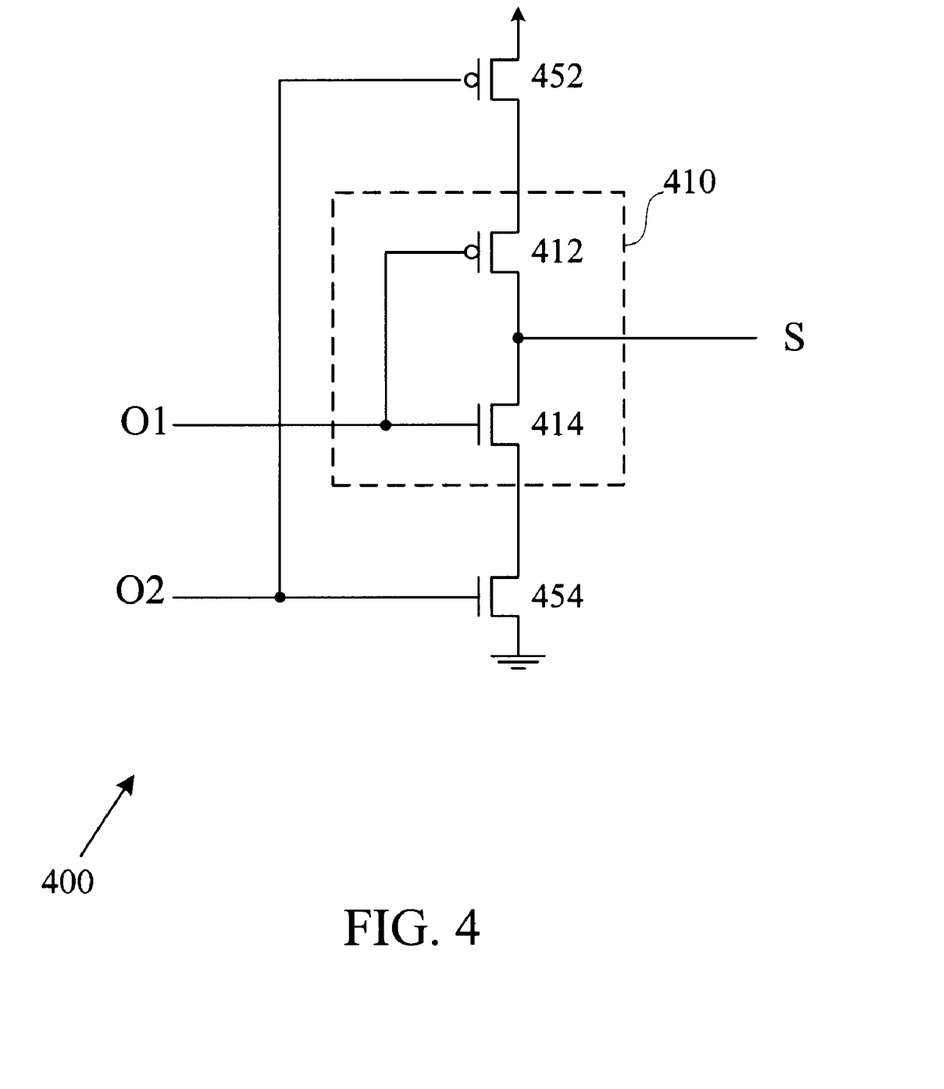
FIG. 4 is a circuit diagram of a dual to single path converter according to an embodiment of the invention.

Output signals O1 and O2 may serve as input signals for the dual to single path converter 400. When one of its input signals experiences a state transition due to a transient pulse, the dual to single path converter 400 provides an output signal S that corresponds to the state of a non-perturbed input signal present at its inputs. Thus, the dual to single path converter 400 may be viewed as a type of transient signal filter. The detailed structure and operation of the dual to single path converter are described hereafter.

FIG. 4 is a circuit diagram of a dual to single path converter 400 according to an embodiment of the invention. In one embodiment, the dual to single path converter 400 comprises an inverter that is incorporated within the current path of another inverter structure. In a Complementary Metal Oxide Semiconductor (CMOS) embodiment, the dual to single path converter 400 comprises an inverter 410 having a first PMOS transistor 412 and a first NMOS transistor 414, where the inverter 410 is coupled to a second PMOS transistor 452 and a second NMOS transistor 454. Each of the aforementioned transistors includes a gate, a source, and a drain in accordance with conventional transistor design.

The gates of the first PMOS and NMOS transistors 412, 414 form a first input of the dual to single path converter 400, and may receive signal O1 provided by an output of the dual path logic gate's first logic element 220. Correspondingly, the gates of the second PMOS and NMOS transistors 452, 454 form a second input of the dual to single path converter 400, and may receive signal O2 provided by the second logic element 230.

The second PMOS transistor 452 is coupled to a high voltage reference or logic 1 value and the first PMOS transistor 412 in a manner readily understood by those skilled in the art. Analogously, the second NMOS transistor 454 is coupled to a low voltage reference or logic 0 value and the first NMOS transistor 414. In one embodiment, the coupling between the first PMOS and NMOS transistors 412, 414 within the first inverter 410 provides a signal S at an output of the dual to single path converter 400.

In the absence of a transient pulse, the dual to single path converter's first and second inputs receive logically equivalent values as provided by signals O1 and O2, respectively. When signals O1 and O2 both correspond to logical 0, the PMOS transistors 412, 452 are in an on state, and the NMOS transistors 414, 454 are in an off state. A conductive path therefore exists between the dual to single path converter's output and the high reference voltage, and the dual to single path converter 400 outputs a logical 1 value. Analogously, when signals O1 and O2 both correspond to logical 1, the PMOS transistors 412,452 are in an off state, and the NMOS transistors 412, 454 are in an on state. The dual to single path converter 400 thus outputs a logical 0 because a conductive path exists between its output and the low reference voltage.

In the event that a transient pulse causes either O1 or O2 to temporarily transition to an opposite state, a conductive path between the dual to single path converter's output and either the high reference voltage or the low reference voltage will be broken. The voltage present at the dual to single path converter's output, however, will be maintained at is most-recent value by the parasitic or stray capacitance present at the output node of the inverter 410, in a manner analogous to that described above.

As an example, in the absence of a transient pulse, O1 and O2 may both equal logic 1, in which case S equals logic 0. If a radiation event produces a transient pulse that results in O2 transitioning to logic 0, the second NMOS transistor 454 transitions to an off state. Thus, the current path between the dual to single path converter's output and the low reference voltage will be broken. Although the second PMOS transistor 452 transitions to an on state when O2 transitions to logic 0, the first PMOS transistor 412 remains in an off state because it is controlled by the value of O1, which equals logic 1. The stray capacitance present at the dual to single path converter's output node maintains signal S at logic 0. Analogous considerations apply when O1 and O2 both equal logic 0 and one of these signals transitions to a logic 1 as a result of a transient pulse, such that S is maintained at logic 1.

The dual to single path converter 400 shown in FIG. 4 outputs an inverted version of identically valued signals present at its input. Referring again to FIG. 3, the dual path inverter 300 outputs inverted versions of redundant input signals. Thus, a dual path inverter 300 coupled to a dual to single path converter 400 may output a noninverted version of a signal presented to the dual path inverter 300. Multiple dual path inverters 300 may be sequentially cascaded to ensure that an appropriate number of inversions occur during the generation or assertion of any given signal. When cascaded, signals O1 and O2 output by a previous inverter stage serve as input signals I1 and I2 for a subsequent inverter stage, where I1 and I2 are coupled within this subsequent inverter stage in the manner shown in FIG. 3.

When dual path inverters 300 are cascaded, one or more dual path inverter stages may be characterized by circuit dimensions larger than those associated with a previous stage (in a manner analogous to a tapered buffer), thereby further minimizing SEU susceptibility. For example, a second dual path inverter stage may be characterized by channel widths approximately 3 times larger than those associated with a first dual path inverter stage. Additionally or alternatively, a conventional inverter structure may be coupled in an output path of a dual to single path converter 400, where the conventional inverter is large enough to remain essentially unaffected by a transient pulse.

Those skilled in the art will recognize that the dual to single path converter 400 of FIG. 4 comprises a Muller C-element inverter. Muller C-element circuits may be encountered in self-timed circuit applications, and may serve as gating elements relative to signal transitions. In terms of algebraic logic, Muller C-elements provide an implementation of a join function, which may be equivalent to an AND function for signal transitions or events.

Figure 5:
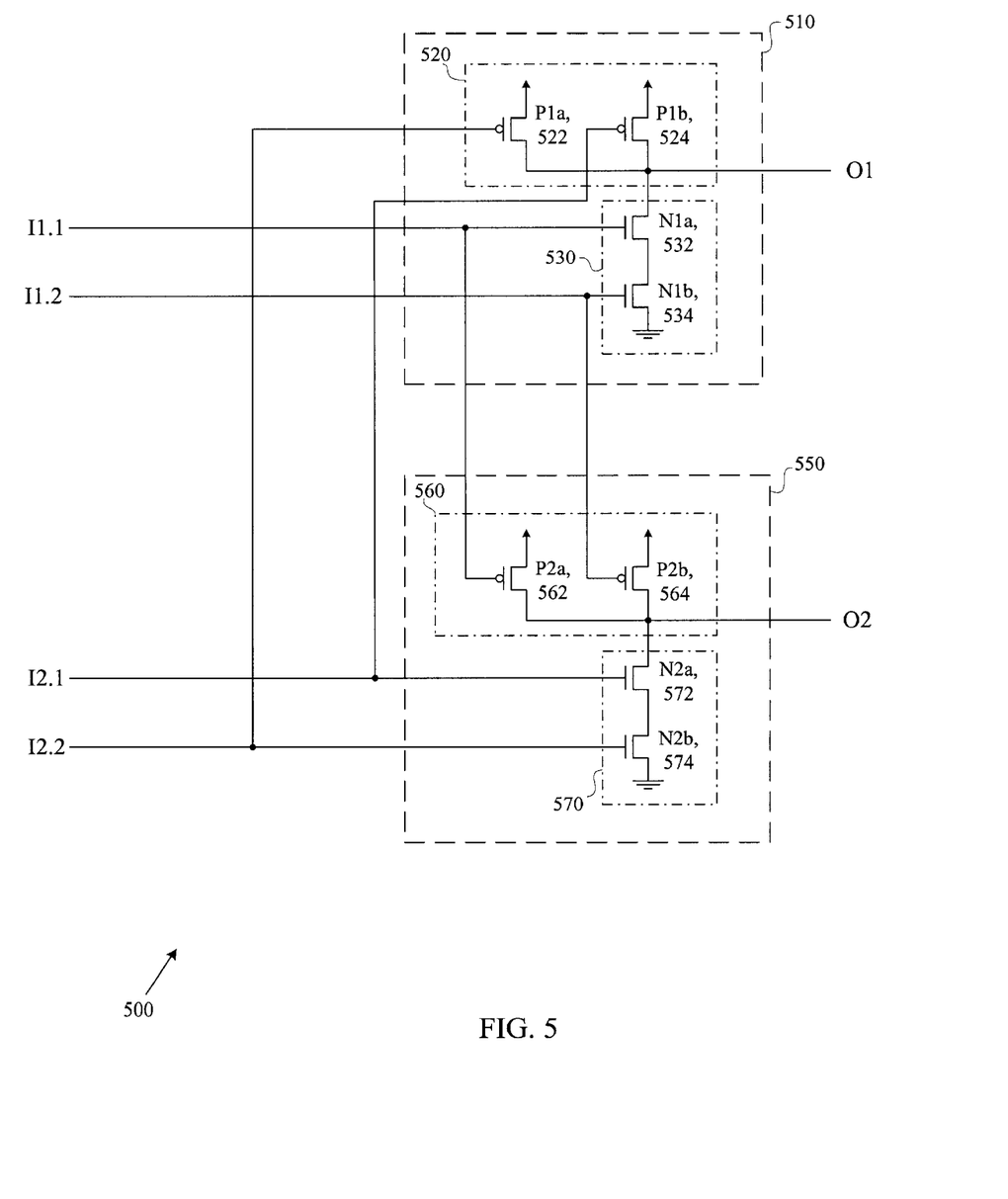
FIG. 5 is a circuit diagram of a dual path NAND gate according to an embodiment of the invention.

FIG. 5 is a circuit diagram of a dual path NAND gate 500 according to an embodiment of the invention. In one embodiment, the dual path NAND gate 500 comprises a first NAND gate 510 and a second NAND gate 550. The first NAND gate 510 comprises a P channel tree 520 coupled to an N channel tree 530, where the P channel tree includes a first PMOS transistor 522 and a second PMOS transistor 524. The N channel tree 530 includes a first and a second NMOS transistor 532, 534. Similarly, the second NAND gate 550 comprises a P channel tree 560 having a first and a second PMOS transistor 562, 564, where the P channel tree 560 is coupled to an N channel tree 570 having a first and a second NMOS transistor 572, 574.

The P channel trees 520, 560 in the first and second NAND gates 510, 550 are coupled to a high voltage reference, and the N channel trees 530, 570 are coupled to a low voltage reference in a manner readily understood by those skilled in the art. Those skilled in the art will further understand that within the first and second NAND gates 510, 550, the coupling between the P and N channel trees 520, 530, 560, 570 provides the dual path NAND gate 500 with a first and second output, respectively. The first output provides or asserts a signal O1, and the second output provides a signal O2.

In the embodiment shown in FIG. 5, the dual path NAND gate 500 operates upon redundant input signal sets I1 and I2, where each such set includes a first and a second signal. As described above, the first and second signals within I1 may be identified as I1.1 and I1.2, respectively; and the first and second signals within I2 may be respectively identified as I2.1 and I2.2.

Within the first NAND gate 510, the N channel tree 530 is controlled by signals I1.1 and I1.2, while the P channel tree 520 is controlled by signals I2.1 and I2.2. Similarly, within the second NAND gate 550, the N channel tree 570 is controlled by signals I2.1 and I2.2, and the P channel tree 560 is controlled by signals I1.1 and I1.2. In particular, the first NAND gate's first and second NMOS transistors 532, 534 are coupled to receive input signals I1.1 and I1.2, respectively, while the second NAND gate's first and second NMOS transistors 572, 574 are respectively coupled to receive input signals I2.1 and I2.2. The first NAND gate's first and second PMOS transistors 522, 524 are coupled to receive I2.2 and I2.1, respectively, while the second NAND gate's first and second PMOS transistors 562, 564 are respectively coupled to receive I1.1 and I1.2. The manner in which input signal cross coupling within the dual path NAND gate 500 may facilitate SEU suppression is described in detail hereafter.

Figure 9:
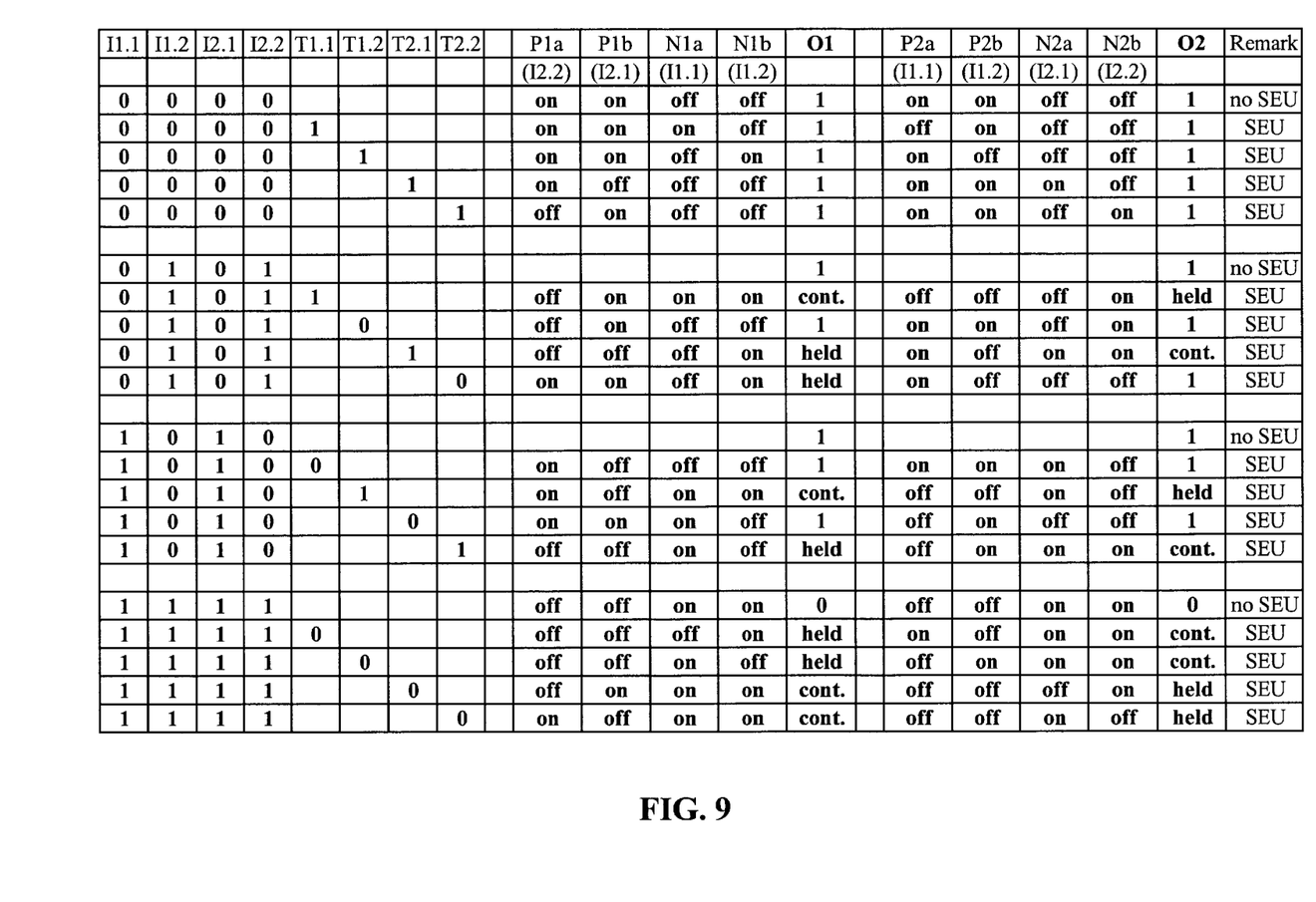
FIG. 9 is a table showing output signal values as a function of input signal values and input signal transitions that may arise from an SEU affecting the dual path NAND gate of FIG. 5.

FIG. 9 shows output signal values as a function of input signal values and input signal transitions that may arise from a transient pulse or SEU affecting the dual path NAND gate of FIG. 5. In FIG. 9, input signal transitions associated with signals I1.1, I1.2, I2.1, and I2.2 are indicated by T1.1, T1.2, T2.1, and T2.2, respectively. Additionally, the first NAND gate's first and second PMOS transistors 522, 524 and first and second NMOS transistors 532, 534 are indicated as P1a, P1b, N1a, and N1b, respectively, in a manner corresponding to FIG. 5. Similarly, the second NAND gate's first and second PMOS transistors 562, 564 and first and second NMOS transistors 572, 574 are respectively indicated as P2a, P2b, N2a, and N2b.

In the absence of an SEU, when signals I1.1, I1.2, I2.1, and I2.2 correspond to logic 0, the dual path NAND gate 500 outputs signals O1 and O2 having a value corresponding to logic 1. A low to high going transient pulse T1.1, T1.2, T2.1, or T2.2 may arise due to an SEU. The PMOS transistors 522, 524, 562, 564 within the first and second P channel trees 520, 560 are coupled in parallel, while the associated NMOS transistors 532, 534, 572, 574 are serially coupled. Thus, as long as 1) one PMOS transistor 522, 524, 562, 564 within each such tree remains on; and 2) one NMOS transistor 532, 534, 572, 574 within each such tree remains off during a low to high transient signal transition that affects one of input signals I1.1, I1.2, I2.1, and I2.2, output signals O1 and O2 remain unchanged.

The couplings within the dual path NAND gate 500 ensure that the aforementioned conditions are met. Hence, in the event that signals I1.1, I1.2, I2.1, or I2.2 equal logic 0, and one of these signals experiences a low to high going transition arising from an SEU, at least one PMOS transistor 522, 524, 562, 564 remains on, and at least one NMOS transistor 532, 534, 572, 574 remains off, as shown in FIG. 9. Thus, when the unperturbed input signals equal logic 0, output signals O1 and O2 are unaffected when one of the input signals makes a low to high going transition as a result of a transient pulse.

In the absence of an SEU, when signals I1.1, I1.2, I2.1, and I2.2 each equal logic 1, the dual path NAND gate 500 outputs signals O1 and O2 having a value of logic 0. An SEU may give rise to a high to low going transient pulse T1.1, T1.2, T2.1, or T2.2. When T1.1 or T1.2 causes input signal I1.1 or input signal I1.2, respectively, to experience a high to low going transition, output signal O2 is undefined because the P and N channel trees 560, 570 within the second NAND gate 550 are in a state of contention. Notwithstanding, the stray capacitance present at the first NAND gate's output node maintains or holds output signal O1 at logic 0 in a manner analogous to that described above, therefore the dual path NAND gate 500 maintains one of its output signal values at the correct value of logic 0 during a high to low going transition T1.1 or T1.2.

If T2.1 or T2.2 causes input signal I2.1 or input signal I2.2, respectively, to experience a high to low going transition, output signal O1 is temporarily undefined because the P and N channel trees 520, 530 within the first NAND gate 510 are in contention. Notwithstanding, the stray capacitance present at the second NAND gate's output node maintains or holds output signal O2 at logic 0 in a manner analogous to that described above, and therefore the dual path NAND gate 500 maintains one of its output signal values at the correct value of logic 0 during a high to low going transition T2.1 or T2.2.

In the absence of an SEU, when (I1.1, I1.2) as well as (I2.1, I2.2) correspond to logic state (01), the dual path NAND gate 500 outputs signals O1 and O2 having a value of logic 1. An SEU may produce a low to high going transient pulse T1.1 or T2.1, or a high to low going transient pulse T2.1 or T2.2. As shown in FIG. 9, in each situation in which one of the aforementioned transient pulses affects one of I1.1, I1.2, I2.1, and I2.2, the dual path NAND gate 500 correctly asserts at least one output signal corresponding to logic 0, the value of signals O1 and O2 prior to the transient pulse.

In the absence of an SEU, when (I1.1, I1.2) as well as (I2.1, I2.2) correspond to logic state (10), the dual path NAND gate 500 outputs signals O1 and O2 having a value of logic 1. An SEU may produce a high to low going transient pulse T1.1 or T2.1, or a low to high going transient pulse T2.1 or T2.2. FIG. 9 shows that in each situation in which one of the aforementioned transient pulses affects one of I1.1, I1.2, I2.1, and I2.2, the dual path NAND gate 500 correctly asserts at least one output signal corresponding to logic 1, the value of signals O1 and O2 prior to the transient pulse.

The foregoing description considers situations in which a transient pulse affects or appears upon one of the input signals I1.1, I1.2, I1.3, and I1.4. That is, the above description does not consider situations in which one or more transient pulses may affect two or more of input signals I1.1, I1.2, I2.2, and I2.2 essentially simultaneously or in a temporally overlapping manner. Such situations may arise when one or more cosmic ray events produce multiple transient pulses. As with the dual path inverter 300, appropriate device geometry and/or design rules may dramatically reduce the likelihood that more than one of such input signals experiences a transient pulse during any given time interval. Furthermore, it can be shown that at any given time, unless each input signal I1.1, I1.2, I2.1, and I2.2 is simultaneously affected by a transient pulse, the dual path NAND gate 500 properly holds or maintains the state of at least one of the output signals O1 and O2.

The dual path NAND gate's output signals O1 and O2 may be applied to the dual to single path converter 400. The dual to single path converter 400 then may produce a single output signal S having a given functional correspondence or mapping to the unperturbed input signal values I1.1, I1.2, I2.1, and I2.2. In a manner analogous to that described above, multiple stages of dual path inverters 300 may be cascaded between a dual path NAND gate 500 and the dual to single path converter 400, and/or a conventional inverter structure may be coupled in the dual to single path converter's output path to ensure that an input to output mapping provides a correctly valued signal. A conventional inverter structure employed in this manner is likely to be large enough to remain essentially unaffected by a transient pulse.

Within the dual path logic element 210, the first and second logic elements 220, 230 may be readily modified to accommodate larger input signal sets. For example, the first and second NAND gates 510, 550 of FIG. 5 may comprise three input NAND gates, where each three input NAND gate is coupled to receive input signals I1.1, I1.2, I1.3, I2.1, I2.2, and I2.3 in an interleaved manner analogous to that shown above.

Figure 6:
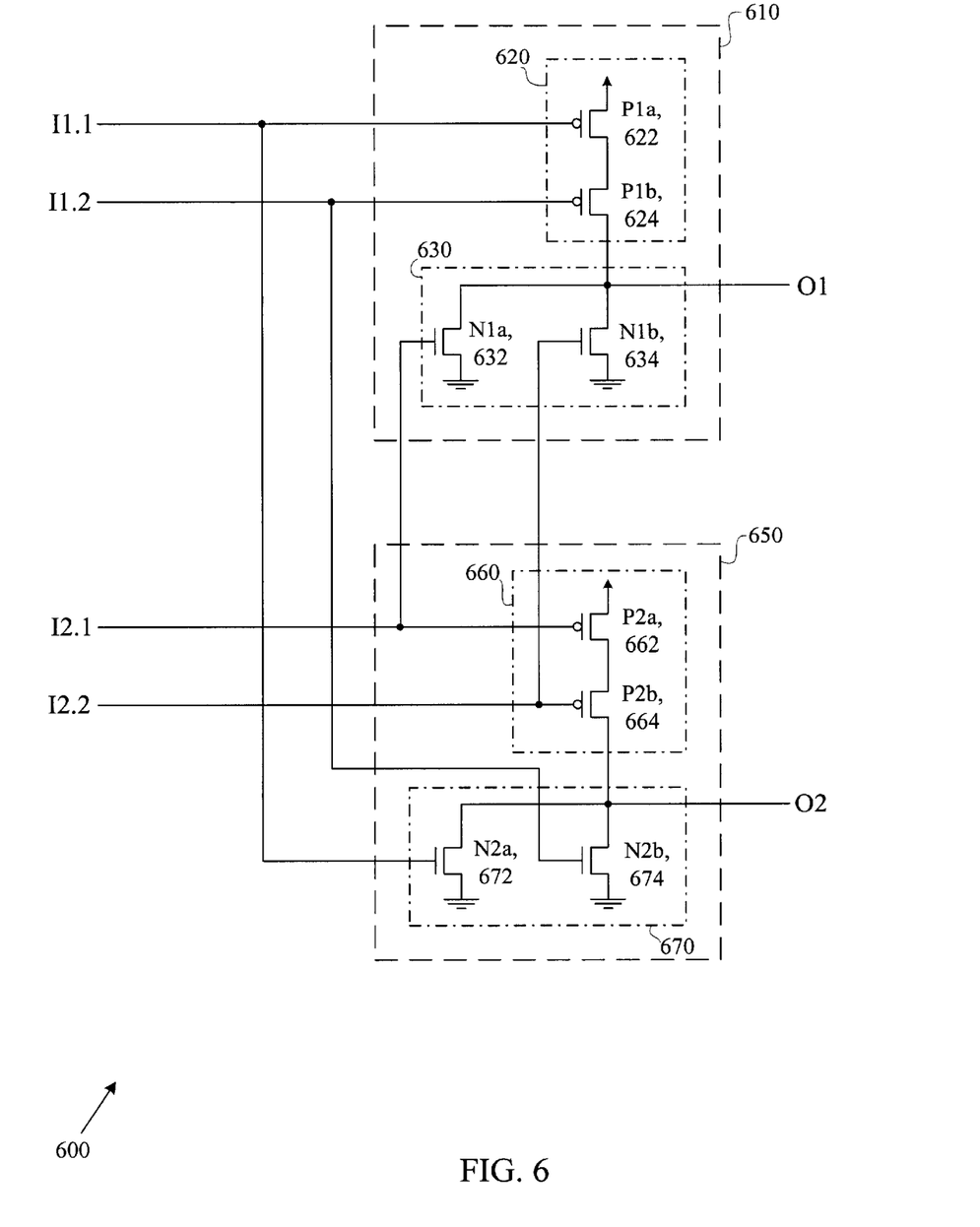
FIG. 6 is a circuit diagram of a dual path NOR gate according to an embodiment of the invention.

FIG. 6 is a circuit diagram of a dual path NOR gate 600 according to an embodiment of the invention. The dual path NOR gate 600 comprises a first NOR gate 610 and a second NOR gate 650. The first NOR gate 610 includes a P channel tree 620 coupled to an N channel tree 630, where the P channel tree 620 includes a first and a second PMOS transistor 622, 624, and the N channel tree 630 includes a first and a second NMOS transistor 632, 634. Similarly, the second NOR gate 650 includes a P channel tree 660 having a first and a second PMOS transistor 662, 664; and an N channel tree 670 having a first and a second NMOS transistor 672, 674.

The P channel trees 620, 660 in the first and second NOR gates 610, 650 are coupled to a high voltage reference, and the N channel trees 630, 670 in the first and second NOR gates 610, 650 are coupled to a low voltage reference in a manner readily understood by those skilled in the art. Those skilled in the art will further understand that within the first and second NOR gates 610, 650, the coupling between the P and N channel trees 620, 630, 660, 670 provides the dual path NOR gate 600 with a first and second output, respectively. The first output provides or asserts a signal O1, and the second output provides a signal O2.

In the embodiment shown in FIG. 6, the dual path NOR gate 600 operates upon redundant input signal sets I1 and I2, where each such set includes a first and a second signal. As described above, the first and second signals within I1 may be identified as I1.1 and I1.2, respectively; and the first and second signals within I2 may be respectively identified as I2.1 and I2.2.

Within the first NOR gate 610, the P channel tree 620 is controlled by signals I1.1 and I1.2, while the N channel tree 630 is controlled by signals I2.1 and I2.2. Similarly, within the second NOR gate 650, the P channel tree 660 is controlled by signals I2.1 and I2.2, while the N channel tree 670 is controlled by signals I1.1 and I1.2. In particular, the first NOR gate's first and second PMOS transistors 522, 524 are respectively coupled to receive signals I1.1 and I1.2, while the second NOR gate's first and second PMOS transistors 662, 664 are respectively coupled to receive signals I2.1 and I2.2. The first NOR gate's first and second NMOS transistors 632, 634 are coupled to receive signals I2.1 and I2.2, respectively, while the second NOR gate's first and second NMOS transistors 672, 674 are coupled to receive signals I1.1 and I1.2, respectively. The manner in which input signal cross coupling within the dual path NOR gate 600 may facilitate SEU suppression is described in detail hereafter.

Figure 10:
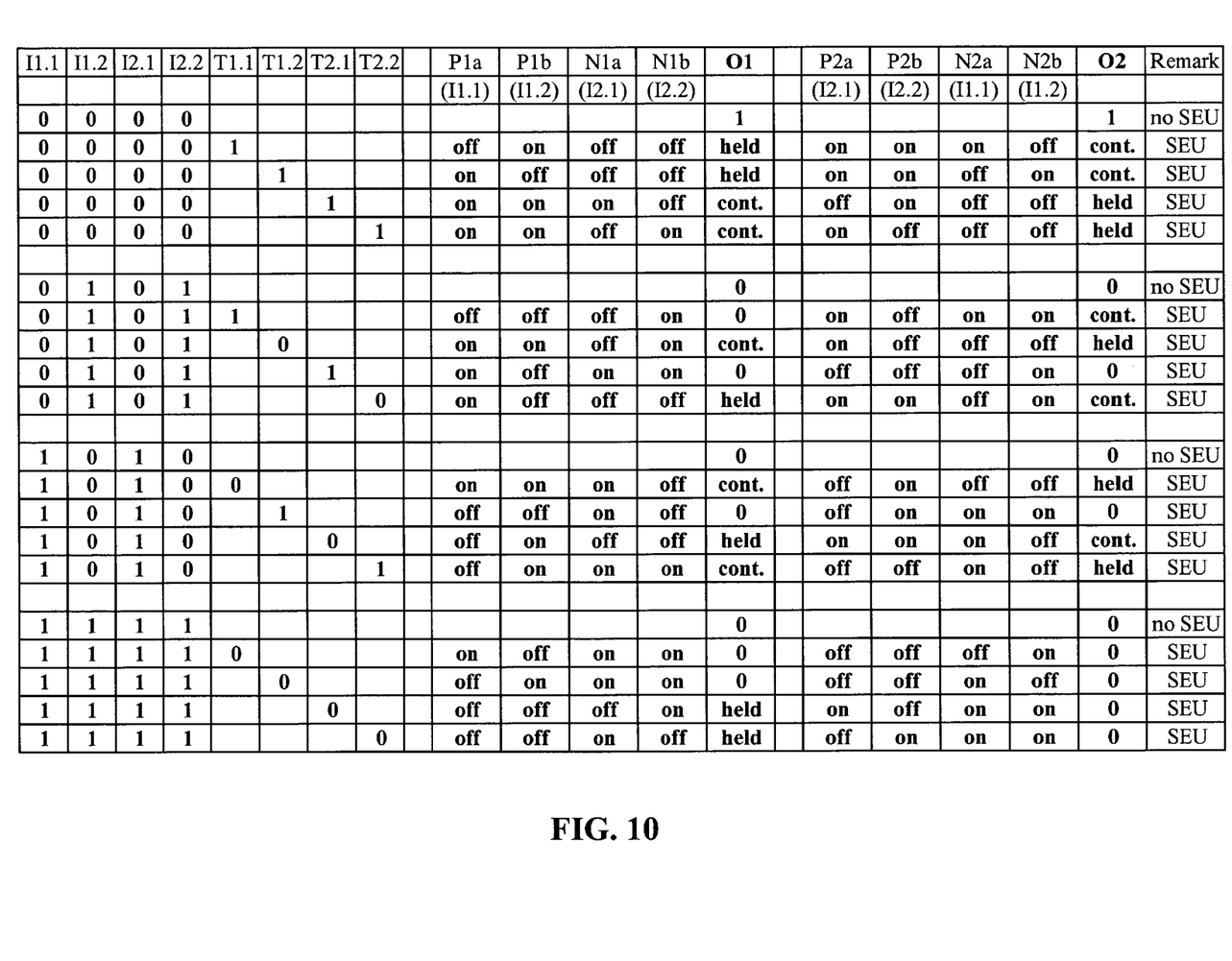
FIG. 10 is a table showing output signal values as a function of input signal values and input signal transitions that may arise from an SEU affecting the dual path NOR gate of FIG. 6.

FIG. 10 shows output signal values as a function of input signal values and input signal transitions that may arise from an SEU or transient pulse affecting the dual path NOR gate 600 of FIG. 6. As above, input signal transitions associated with signals I1.1, I1.2, I2.1, and I2.2 are indicated by T1.1, T1.2, T2.1, and T2.2, respectively, in FIG. 10. Additionally, the first NOR gate's first and second PMOS transistors 622, 624 and first and second NMOS transistors 632, 634 are indicated as P1a, P1b, N1a, and N1b, respectively, in a manner corresponding to FIG. 6. Similarly, the second NOR gate's first and second PMOS transistors 662, 664 and first and second NMOS transistors 672, 674 are respectively indicated as P2a, P2b, N2a, and N2b.

As shown in FIG. 10, in the event that an SEU produces a transient pulse that affects one of input signals I1.1, I1.2, I2.1, and I2.2, the dual path NOR gate 600 asserts or maintains at least one of output signals O1 and O2 at a correct value that existed prior to the transient pulse. Relative to situations in which one or multiple cosmic ray events produce multiple transient pulses and hence affect multiple input signals essentially simultaneously, considerations analogous to those given above for the dual path NAND gate 500 apply equally to the dual path NOR gate 600. Considerations analogous to those given above for the dual path NAND gate 500 relative to generating a desired input to output mapping also apply to the dual path NOR gate 600. In particular, dual path NOR gate output signals may be applied to one or more stages of dual path inverters 300, which may in turn be coupled to a dual to single path converter 400. Alternatively or additionally, a larger scale conventional inverter may be coupled to the dual to single path converter's output.

The concepts herein relating to dual path logic elements 210, 220 and/or dual to single path converters 400 may be applied to create an SEU immune implementation of essentially any combinational circuit or module. For example, a dual path XOR gate may comprise a first and a second XOR structure to which input signals within redundant input signal sets are applied in a cross coupled or interleaved manner analogous to that described above. Similar considerations apply to other types of dual path gates, as well as dual path multiplexors, multipliers, and/or essentially any combinational module or element.

Particular arrangements of dual path logic elements 210, dual to single path converters 400, and/or other logic structures may correspond to one or more portions of standard cells that define reusable building blocks for implementing commonly required logic or circuit functionality. Standard cells that incorporate SEU immune logic elements designed or defined in accordance with the teachings herein may facilitate automatic synthesis of SEU immune circuits from high level circuit descriptions.

Figure 7:
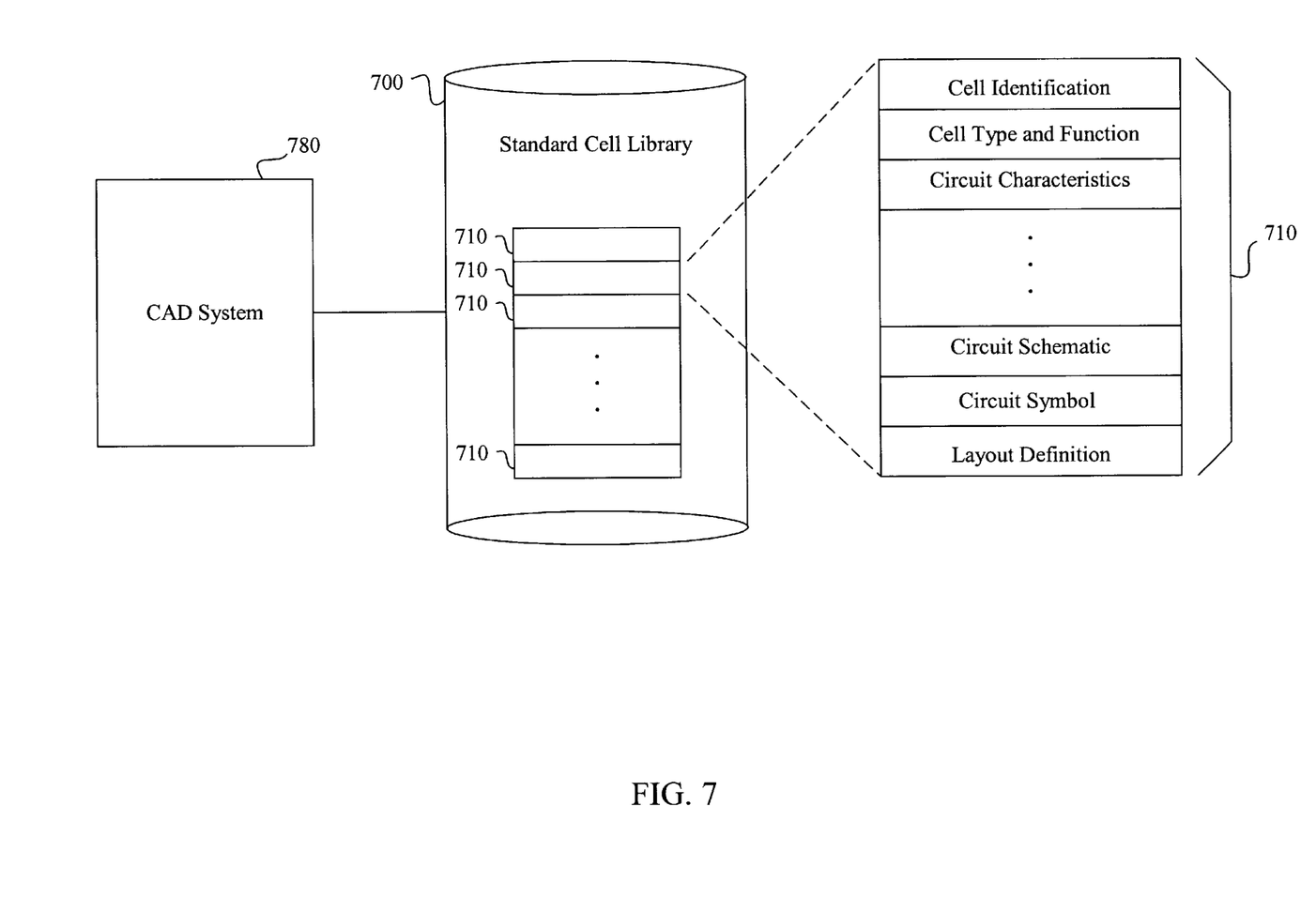
FIG. 7 is a block diagram of a standard cell library that includes SEU immune logic cells defined in accordance with an embodiment of the invention.

FIG. 7 is a block diagram of a standard cell library 700 that includes a set of SEU immune logic cells 710 according to an embodiment of the present invention. In one embodiment, an SEU immune logic cell 710 comprises a data structure that may include data fields for storing 1) a cell name or identification; 2) a cell type, category and/or function; 3) a set of parameters defining associated circuit characteristics, such as fan out, input ports, and/or input capacitance; 4) a reference to a corresponding circuit schematic file defining an associated schematic that may depict SEU immune logic circuits designed in accordance with the teachings or concepts herein, and possibly other types of circuitry; 5) a reference to a corresponding symbol description file; 6) a reference to a corresponding circuit layout file; and/or other information. The standard cell library 700 may include, for example, SEU immune logic cells 710 corresponding to a 2 input dual path NAND/AND circuit, a 4 input dual path NOR gate, a 4:1 dual path multiplexor, and/or other logic circuits. One or more portions of the standard cell library 700 may reside upon a storage device, and/or within a memory associated with a Computer Aided Design (CAD) system 780.

What is claimed is:

1. A data structure corresponding to a standard cell associated with a standard cell library, the data structure comprising a data field corresponding to a schematic that defines a circuit comprising:

a first logic circuit having an output, a first input coupled to receive a first version of a first input signal, and a second input coupled to receive a second version of a second input signal;

a second logic circuit having an output, a first input coupled to receive a second version of the first input signal, and a second input coupled to receive a first version of the second input signal, the second logic circuit logically equivalent to the first logic circuit; and a conversion circuit having an output, a first input coupled to the output of the first logic circuit, and a second input coupled to the output of the second logic circuit, the conversion circuit comprising a first inverter circuit that forms a portion of a current path within a second inverter circuit, wherein the first and second versions of the first input signal correspond to an identical value in the absence of a transient pulse, and the first and second versions of the second input signal correspond to an identical value in the absence of a transient pulse.

2. A data structure corresponding to a standard cell associated with a standard cell library, the data structure comprising a data field corresponding to a circuit layout that defines a circuit comprising:

a first logic circuit having an output, a first input coupled to receive a first version of a first input signal, and a second input coupled to receive a second version of a second input signal;

a second logic circuit having an output, a first input coupled to receive a second version of the first input signal, and a second input coupled to receive a first version of the second input signal, the second logic circuit logically equivalent to the first logic circuit; and a conversion circuit having an output, a first input coupled to the output of the first logic circuit, and a second input coupled to the output of the second logic circuit, the conversion circuit comprising a first inverter circuit that forms a portion of a current path within a second inverter circuit, wherein the first and second versions of the first input signal correspond to an identical value in the absence of a transient pulse, and the first and second versions of the second input signal correspond to an identical value in the absence of a transient pulse.

3. A computer readable medium storing a data structure corresponding to a standard cell, the standard cell associated with a standard cell library, the data structure comprising a data field corresponding to a circuit schematic that defines a circuit comprising:

a first logic circuit having an output, a first input coupled to receive a first version of a first input signal, and a second input coupled to receive a second version of a second input signal;

a second logic circuit having an output, a first input coupled to receive a second version of the first input signal, and a second input coupled to receive a first version of the second input signal, the second logic circuit logically equivalent to the first logic circuit; and a conversion circuit having an output, a first input coupled to the output of the first logic circuit, and a second input coupled to the output of the second logic circuit, the conversion circuit comprising a first inverter circuit that forms a portion of a current path within a second inverter circuit, wherein the first and second versions of the first input signal correspond to an identical value in the absence of a transient pulse, and the first and second versions of the second input signal correspond to an identical value in the absence of a transient pulse.

4. A computer readable medium storing a data structure corresponding to a standard cell, the standard cell associated with a standard cell library, the data structure comprising a data field corresponding to a circuit layout that defines a circuit comprising:

a first logic circuit having an output, a first input coupled to receive a first version of a first input signal, and a second input coupled to receive a second version of a second input signal;

a second logic circuit having an output, a first input coupled to receive a second version of the first input signal, and a second input coupled to receive a first version of the second input signal, the second logic circuit logically equivalent to the first logic circuit; and a conversion circuit having an ouput, a first input coupled to the output of the first logic circuit, and a second input coupled to the output of the second logic circuit, the conversion circuit comprising a first inverter circuit that forms a portion of a current path within a second inverter circuit, wherein the first and second versions of the first input signals correspond to an identical value in the absence of a transient pulse, and the first and second versions of the second input signal correspond to an identical value in the absence of a transient pulse.

5. A data structure corresponding to a standard cell associated with a standard cell library, the data structure comprising a data field corresponding to a schematic that defines a circuit comprising:

a first inverter circuit having an ouput, a first input coupled to receive a first version of a first input signal, and a second input coupled to receive a second version of a second input signal;

a second inverter having an ouput, a first input coupled to receive a second version of the first input signal, and a second input coupled to receive a first version of the second input signal;

a third inverter circuit having an output, a first input coupled to receive a first version of a signal output by the first inverter circuit, and a second input coupled to receive a second version of a signal output by the second inverter circuit;

a fourth inverter circuit having an output, a first input coupled to receive a second version of a signal output by the first inverter circuit, and a second input coupled to receive a first version of a signal output by the second inverter circuit; and a conversion circuit having an output, a first input coupled to the output of the third inverter circuit, and a second input coupled to the output of the fourth inverter circuit, the conversion circuit comprising a fifth inverter circuit that forms a portion of a current path within a sixth inverter circuit, wherein the first and second versions of the first input signal correspond to an identical value in the absence of a transient pulse, the first and second versions of the second input signal correspond to an identical value in the absence of a transient pulse, the first and second versions of the signal output by the first inverter circuit correspond to an identical value in the absence of a transient pulse, and the first and second versions of the signal output by the second inverter circuit correspond to an identical value in the absence of a transient pulse.

6. A data structure corresponding to a standard cell associated with a standard cell library, the data structure comprising a data field corresponding to a schematic that defines a circuit comprising:

a first NAND circuit having an output, a first input coupled to receive a first version of a first input signal, and a second input coupled to receive a second version of a second input signal; and a second NAND circuit having an output, a first input coupled to receive a second version of the first input signal, and a second input coupled to receive a first version of the second input signal, the second NAND circuit logically equivalent to the first NAND circuit, wherein the first and second versions of the first input signal correspond to an identical value in the absence of a transient pulse, and the first and second versions of the second input signal correspond to an identical value in the absence of a transient pulse.

7. A data structure corresponding to a standard cell associated with a standard cell library, the data structure comprising a data field corresponding to a schematic that defines a circuit comprising:

a first NOR circuit having an output, a first input coupled to receive a first version of a first input signal, and a second input coupled to receive a second version of a second input signal; and a second NOR circuit having an output a first input coupled to receive a second version of the first input signal, and a second input coupled to receive a first version of the second input signal, the second NOR circuit logically equivalent to the first NOR circuit, wherein the first and second versions of the first input signal correspond to an identical value in the absence of a transient pulse, and the first and second versions of the second input signal correspond to an identical value in the absence of a transient pulse.

8. A circuit, comprising:

a first logic circuit operable to receive first and second input signals, to generate a first output signal having a first logic value in response to the first and second input signals each having a same logic value, and to maintain the first output signal at the first logic value in response to a transient pulse superimposed on one of the first and second input signals; and a second logic circuit operable to receive the first and second input signals, to generate a second output signal having the first logic value in response to the first and second input signals each having the same logic value, and to maintain the second output signal at the first logic value in response to a transient pulse superimposed on the other of the first and second input signals.

9. The circuit of claim 8 wherein the same logic value comprises a second logic value that is the complement of the first logic value.

10. The circuit of claim 8 wherein the first and second logic circuits respectively comprise first and second inverters.

11. A method, comprising:

generating first and second output signals each having a first logic value in response to first and second input signals each having a same logic value: and maintaining at least one of the first and second output signals at the first logic value in response to a transient pulse superimposed on one of the first and second input signals.

12. The method of claim 11 wherein the same logic value comprises a second logic value that is the complement of the first logic value.

13. A method, comprising:

generating an output signal having a first logic value in response to first and second input signals each having a same logic value: and maintaining the output signal at the first logic value in response to a transient pulse superimposed on one of the first and second input signals.

14. The method of claim 13 wherein the same logic value comprises a second logic value that is the complement of the first logic value.

15. A method, comprising:

generating first and second intermediate signals each having a first logic value in response to first and second input signals each having a second logic value;

maintaining at least one of the first and second intermediate signals at the first logic value in response to a transient pulse superimposed on one of the first and second input signals;

generating an output signal having the second logic value in response to the first and second intermediate signals each having the first logic value; and maintaining the output signal at second logic value in response to a transient pulse superimposed on one of the first and second intermediate signals.

16. The method of claim 15 wherein the second logic value is of the first logic value.

17. A method, comprising:

generating a first output signal having a logic value that is equal to a logical inversion of first and second versions of an input signal;

generating a second output signal having the logic value; and maintaining at least one of the first and second output signals at the logic value in response to a transient pulse superimposed on one of the versions of the input signal.

18. A method, comprising:

generating a first output signal having a logic value that is equal to a logical NAND of first and second versions of a first input signal and first and second versions of a second input signal;

generating a second output signal having the logic value; and maintaining at least one of the first and second output signals at the logic value in response to a transient pulse superimposed on one of the versions of the first and second input signals.

19. The method of claim 18 wherein maintaining comprises maintaining at least one of the first and second output signals at the logic value in response to one or more transient pulses superimposed on more than one of the versions of the first and second input signals.

20. A method, comprising:

generating a first output signal having a logic value that is equal to a logical NOR of first and second versions of a first input signal and first and second versions of a second input signal;

generating a second output signal having the logic value; and maintaining at least one of the first and second output signals at the logic value in response to a transient pulse superimposed on one of the versions of the first and second input signals.

21. The method of claim 20 wherein maintaining comprises maintaining at least one of the first and second output signals at the logic value in response to one or more transient pulses superimposed on mare than one of the versions of the first and second input signals.

* * * * *

UNITED STATES PATENT AND TRADEMARK OFFICE
CERTIFICATE OF CORRECTION

PATENT NO. : 6,703,858 B2
DATED : March 9, 2004
INVENTOR(S) : Kenneth R. Knowles It is certified that error appears in the above-identified patent and that said Letters Patent is hereby corrected as shown below:

Column 14,
Line 27, should read as follows: -- ... a second inverter circuit having an output, ... --

Column 15,
Line 18, should read as follows: -- ... a second NOR circuit having an output, a first input.. --
Line 52, should read as follows: -- ... signals each having a same logic value; and... --
Line 54, should read as follows: -- ... signals at the first logic value in response to transient... --
Line 63, should read as follows: -- ... a same logic value: ... --

Column 16,
Line 21, should read as follows: -- ... value is the compliment of the first logic value. --

Signed and Sealed this

Seventeenth Day of August, 2004

JON W. DUDAS
*Acting Director of the United States Patent and Trademark Office*